United States Patent
Twerdochlib (10) Patent No.: US 8,098,072 B2
(45) Date of Patent: Jan. 17, 2012

(54) PARTIAL DISCHARGE COUPLER FOR APPLICATION ON HIGH VOLTAGE GENERATOR BUS WORKS

(75) Inventor: Michael Twerdochlib, Oviedo, FL (US)

(73) Assignee: Siemens Energy, Inc., Orlando, FL (US)

( * ) Notice: Subject to any disclaimer, the term of this patent is extended or adjusted under 35 U.S.C. 154(b) by 550 days.

(21) Appl. No.: 12/360,923

(22) Filed: Jan. 28, 2009

(65) Prior Publication Data

US 2010/0073008 A1    Mar. 25, 2010

Related U.S. Application Data

(60) Provisional application No. 61/099,648, filed on Sep. 24, 2008.

(51) Int. Cl.
 *G01R 31/02* (2006.01)
 *H01H 9/50* (2006.01)
(52) U.S. Cl. ....................... 324/536; 324/551
(58) Field of Classification Search .................. 324/536, 324/551
See application file for complete search history.

(56) References Cited

U.S. PATENT DOCUMENTS

| | | | |
|---|---|---|---|
| 4,224,486 A | 9/1980 | Zimmerman, Jr. et al. | |
| 4,277,746 A * | 7/1981 | Abe et al. | 324/72 |
| 4,779,051 A | 10/1988 | Grunewald et al. | |
| 4,814,699 A | 3/1989 | Koziel et al. | |
| 4,897,607 A | 1/1990 | Grunewald et al. | |
| 5,173,572 A | 12/1992 | Martin | |
| 5,323,117 A | 6/1994 | Endoh et al. | |
| 5,469,067 A | 11/1995 | Endoh et al. | |
| 5,680,059 A | 10/1997 | Shiota et al. | |
| 5,814,998 A | 9/1998 | Gruenewald et al. | |
| 5,834,940 A | 11/1998 | Brooks et al. | |
| 5,933,012 A * | 8/1999 | Bengtsson et al. | 324/536 |
| 5,991,137 A | 11/1999 | Krahn et al. | |
| 6,285,538 B1 | 9/2001 | Krahn | |
| 6,937,027 B2 | 8/2005 | Koo et al. | |
| 6,937,029 B2 | 8/2005 | Gambardella et al. | |
| 7,354,287 B1 | 4/2008 | Hickam | |
| 2007/0057677 A1 | 3/2007 | Koch et al. | |

FOREIGN PATENT DOCUMENTS

| | | |
|---|---|---|
| EP | 1645887 A2 | 4/1906 |
| EP | 0488719 A2 | 11/1992 |
| EP | 1367678 A2 | 3/2003 |
| GB | 2429790 A | 3/2007 |

* cited by examiner

*Primary Examiner* — Timothy J Dole (57) ABSTRACT

A partial discharge coupler for detecting partial discharges in a conductor includes a frequency dependent network, a differential amplifier and a frequency selective coupling component. The frequency dependent network includes a first filter component, a fuse component and a load component, typically coupled together in series with reference to a first ground. The first filter component filters the high voltage, low frequency alternating current signal carried by the conductor from the load component and passes high frequency partial discharge pulse signals to the load component. The frequency selective coupling component couples in series between the differential amplifier and the load component. The output of the differential amplifier is configured to provide an output that is isolated from the ground connection for communicating detected partial discharge signals to partial discharge test equipment.

20 Claims, 7 Drawing Sheets

PARTIAL DISCHARGE COUPLER FOR APPLICATION ON HIGH VOLTAGE GENERATOR BUS WORKS

CROSS-REFERENCE TO RELATED APPLICATION

This application claims the benefit of U.S. Provisional Application Ser. No. 61/099,648, entitled A PARTIAL DISCHARGE COUPLER FOR APPLICATION ON HIGH VOLTAGE GENERATOR BUS WORKS, filed Sep. 24, 2008, the entire disclosure of which is incorporated by reference herein.

BACKGROUND OF THE INVENTION

The present invention relates in general to partial discharge couplers, and in particular, to partial discharge couplers for use with high voltage generator bus works.

High voltage electrical applications, such as high-voltage dynamoelectric machines, electrical generators in power plants, etc., represent capital intensive installations and typically require high availability in order to be operated in an economical manner. However, a breakdown of the insulation in such a high voltage electrical application can have significant consequences, including potential damage to the electrical device and/or components electrically coupled to the device. In this regard, proactive measures may be utilized to predict an impending breakdown. One such proactive strategy is to evaluate an indicator of the integrity of a high voltage electrical device by measuring partial discharges.

Partial discharges are small electrical sparks that occur within the insulation of electrical devices, such as windings in motors and generators. Partial discharges may also occur within the insulation of other electrical devices that are subject to high voltages, such as transformers and cables. More particularly, a partial discharge represents a localized breakdown of the electrical insulation of a component under high voltage stress. For example, localized breakdowns may occur in small air pockets within the electrical insulation. These electrical breakdowns exhibit themselves as high frequency electric current pulses that flow through the air pockets. Partial discharge measurements can be used as a predictor of reliability of the insulation of an electrical conductor, and thus a need for maintenance of the electrical device.

Accordingly, it is common to monitor power plant generators, either continuously or at regular intervals to identify the occurrence of partial discharges that could be indicative of impending component failure. In an exemplary partial discharge monitor in power plants, passive partial discharge couplers are provided on each isophase bus connecting a generator to a corresponding step up transformer. Partial discharge pulses detected by the partial discharge couplers are carried to testing equipment along corresponding signal lines for measurement and subsequent analysis.

SUMMARY OF THE INVENTION

According to various aspects of the present invention, a partial discharge coupler is provided, for detecting partial discharges in a conductor carrying a high voltage alternating current signal. The partial discharge coupler includes a frequency dependent network, a differential amplifier and a frequency selective coupling component that couples the differential amplifier to the frequency dependent network.

The frequency dependent network may include a first filter component, a fuse component and a load component. The first filter component is configured to filter the high voltage, low frequency, alternating current signal carried by the conductor from the load component and is further configured to pass high frequency partial discharge pulse signals to the load component when the partial discharge coupler is installed between the conductor and a ground.

The fuse component is configured to provide overload protection to the partial discharge coupler if a signal through the fuse component exceeds a predetermined fuse condition. For example, where the partial discharge coupler is installed between a power bus and an earth ground, the fuse component may comprise a fast clearing fuse that employs sub-60 Hz cycle operation to provide disconnect of the partial discharge coupler from the power bus if the predetermined fuse condition is exceeded.

The load component defines a first node and a second node. The first node is connected to the remainder of the network and the second node is coupled to ground when the frequency dependent network is installed between the conductor and the ground.

The differential amplifier includes a first differential input, a second differential input and an output. The frequency selective coupling component is coupled in series between the first differential input of the differential amplifier and the first node of the load component, and is configured to pass high frequency partial discharge signals to the differential amplifier, and to filter low frequency alternating current signals from the differential amplifier. The second differential input of the differential amplifier is coupled to the second node of the load component, and the output of the differential amplifier is configured to provide an output that is isolated from the first ground connection for communicating detected partial discharge signals to partial discharge test equipment.

According to further aspects of the present invention, a partial discharge coupler is provided for detecting partial discharges in a conductor carrying a high voltage alternating current signal. The partial discharge coupler includes a frequency dependent network having a first filter component, a fuse component and a load component, connected in series with each other. The first filter component is configured to filter the high voltage, low frequency alternating current signal carried by the conductor from the load component and to pass high frequency partial discharge pulse signals to the load component when the partial discharge coupler is installed between the conductor and a ground. The fuse component is configured to provide overload protection to the partial discharge coupler if a signal through the fuse component exceeds a predetermined fuse condition. The load component defines a first node and a second node. The first node is connected to the remainder of the series network and the second node is coupled to the ground when the frequency dependent network is installed between the conductor and the ground.

The partial discharge coupler further includes a connector socket having a first socket connection, a second socket connection and a shorting connection. The shorting connection electrically couples (shunts) the first socket connection to the second socket connection when no corresponding plug is inserted into the socket connection. The shorting connection also electrically disconnects the first socket connection from the second socket connection when a corresponding plug is connected to the connector socket. A frequency selective coupling component is coupled in series between the first socket connection of the connector socket and the first node of the load component. Moreover, the second socket connection is coupled to the second node of the load component.

The partial discharge coupler may further include a differential amplifier having a first differential input, a second differential input and an output. The output of the differential amplifier is typically communicated to partial discharge analysis equipment and is configured to provide an output that is isolated from the ground connection of the frequency dependent network. Still further, a plug is coupled to the differential amplifier that can be selectively plugged into and removed from connection with the connector socket, such that when the plug is connected to the connector socket, the first differential input of the differential amplifier is coupled to the frequency dependent coupling component via the first socket connection and the second differential input of the differential amplifier is coupled to the second node of the load component via the second socket connection.

In this regard, the differential amplifier may be selectively attached to, and removed from the frequency dependent network via the plug and corresponding connector socket. Moreover, either the differential amplifier and/or shunt is electrically connected (in place) across the connector socket, depending upon whether or not the plug is mated with its corresponding connector socket. As such, the frequency selective coupling component is not left in an electrically open circuit state.

According to still further aspects of the present invention, a partial discharge coupling system for coupling an electrical generator having at least one bus bar that carries a high voltage, low frequency alternating current signal to partial discharge testing equipment is provided. The system includes at least two partial discharge couplers associated with each bus bar that are spaced from each other by a predetermined distance. Each partial discharge coupler includes a frequency dependent network for installation between the associated bus bar and a ground, including a first filter component, a fuse component and a load component. The first filter component filters low frequency signals from the load component and passes high frequency partial discharge pulse signals to the load component. The load component defines a first node and a second node.

Moreover, each partial discharge coupler includes a differential amplifier having a first differential input, a second differential input and an output that is provided with respect to a reference that is isolated from the ground coupled to the load component. A frequency selective coupling component is coupled in series between the first differential input of the differential amplifier and the first node of the load component. The second differential input of the differential amplifier is coupled to the second node of the load component.

BRIEF DESCRIPTION OF THE DRAWINGS

The following detailed description of various aspects of the present invention can be best understood when read in conjunction with the following drawings, where like structure is indicated with like reference numerals, and in which.

DETAILED DESCRIPTION OF THE INVENTION

In the following detailed description, reference is made to the accompanying drawings that form a part hereof, and in which is shown by way of illustration, and not by way of limitation, specifics from which various aspects of the present invention may be practiced. It is to be understood that other aspects may be utilized and that changes may be made without departing from the spirit and scope of the present invention.

Figure 1:
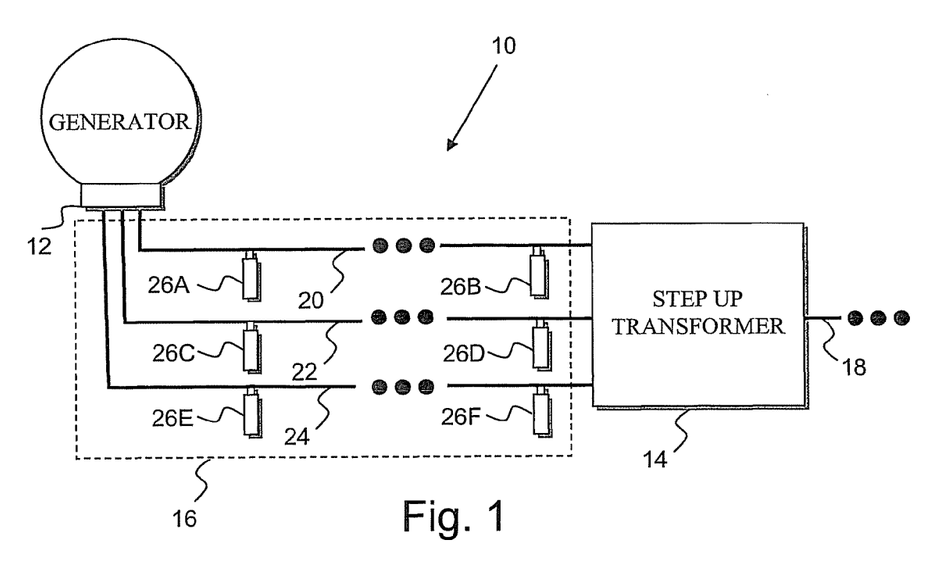
FIG. 1 is a diagrammatic view of a power plant system including partial discharge couplers according to various aspects of the present invention.

Referring now to the drawings, and in particular, to FIG. 1, a power plant system 10 includes in general, an electrical generator, e.g., a turbine generator 12 that is electrically coupled to a step-up transformer 14 by a generator bus works 16. The step-up transformer 16 is further coupled to downstream power lines 18 for delivering electrical power outside of the power plant system 10. The generator bus works 16 typically includes one or more electrically insulated isophase buses. For example, the generator bus works 16 illustrated in FIG. 1 is implemented as three isophase buses, including a first isophase bus 20, a second isophase bus 22 and a third isophase bus 24.

Each isophase bus 20, 22 and 24 comprises a conductor that carries a high voltage alternating current signal. In the illustrative example, each isophase bus 20, 22 and 24 conducts a high voltage, e.g., approximately 5 Kilovolts to approximately 30 Kilovolts, 60 Hz signal from the generator 12 to the step-up transformer 14. Moreover, the high voltage alternating current signal carried by each of the isophase buses 20, 22 and 24 is 120 degrees out of phase with the signals carried by the other isophase buses.

Each isophase bus 20, 22 and 24 comprises a conductor that is electrically insulated from each other using a suitable insulator layer. For example, each isophase bus may comprise a large internal current carrying bus conductor that is suspended in air by porcelain supports. Moreover, the porcelain supports are mounted to the inner surface of a grounded cover/shield such as an outer cylindrical member. The large air gap between the center bus conductor and outer grounded cover provides electrical insulation. Partial discharge can occur within this bus work. However, partial discharges are more problematic in the generator 12 and step-up transformer 14. In particular, partial discharges such as small sparks can occur in the insulation around the generator and step-up transformer winding e.g., via localized breakdowns in small air pockets within the electrical insulation. These partial discharges do not propagate completely from phase to phase or phase to ground. Therefore, measurement and analysis of these partial discharges can provide an early warning of insulation failures in high voltage electrical devices.

According to various aspects of the present invention, partial discharge coupler are provided, which are designated generally by the reference numeral 26. The partial discharge couplers 26 are capable of detecting partial discharge pulse information in the generator 12, step-up transformer 14 and/ or generator bus works 16. The detected partial discharge pulse information is then conveyed to corresponding testing and analysis equipment (not shown in FIG. 1).

For example, FIG. 1 illustrates two partial discharge couplers 26A, 26B that are spaced apart from each other and are coupled to the first isophase bus 20. Two partial discharge couplers 26C, 26D are spaced apart from each other and are coupled to the second isophase bus 22. Also, two partial discharge couplers 26E, 26F are spaced apart from each other and are coupled to the third isophase bus 24. Although illustrated as having two partial discharge couplers on each isophase, other arrangements may alternatively be implemented, depending for example, upon the particular application and/or partial discharge measuring requirements. Moreover, even though the partial discharge couplers 26 are illustrated as being coupled to the generator bus works 16 in FIG. 1, such partial discharge couplers 26 may be utilized to capture partial discharge pulse information for any number of alternative high voltage electrical devices.

Figure 2:
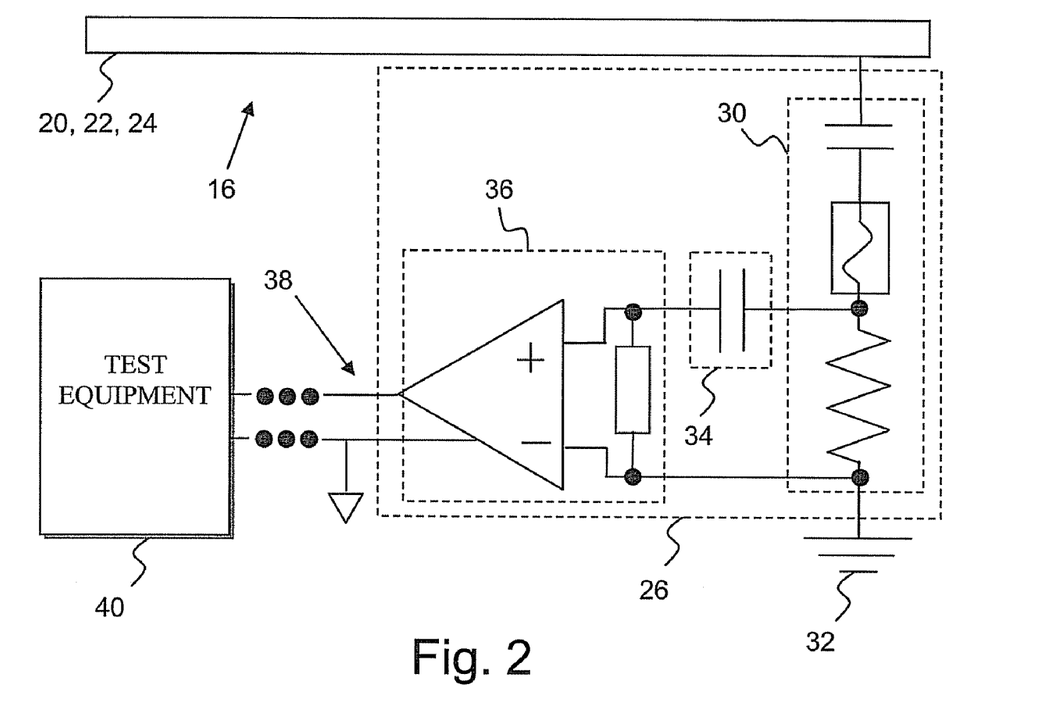
FIG. 2 is a diagrammatic view of a partial discharge coupler according to various aspects of the present invention.

Referring to FIG. 2, a partial discharge coupler 26 is illustrated according to various aspects of the present invention. In general, the partial discharge coupler 26 comprises a frequency dependent network 30 that may be connected between an electrical device, e.g., an isophase bus bar such as one of the isophase bus bars 20, 22, 24 discussed with reference to FIG. 1, and a first ground reference 32, e.g., an earth ground. A coupling component 34 couples the frequency dependent network 30 to an amplifier circuit 36. The partial discharge coupler 26 also provides an output 38 from the amplifier circuit 36 that may be coupled to test equipment 40, e.g., a partial discharge analyzer or other suitable equipment for analyzing partial discharge pulses. In practice, the isophase bus outer cylindrical shield is typically earth grounded. As such, the partial discharge coupler 26 may be installed within an extension, i.e., a modification, of the isophase bus outer cylindrical shield, which is configured to insure proper high voltage isolation of the inner bus conductor.

Figure 3:
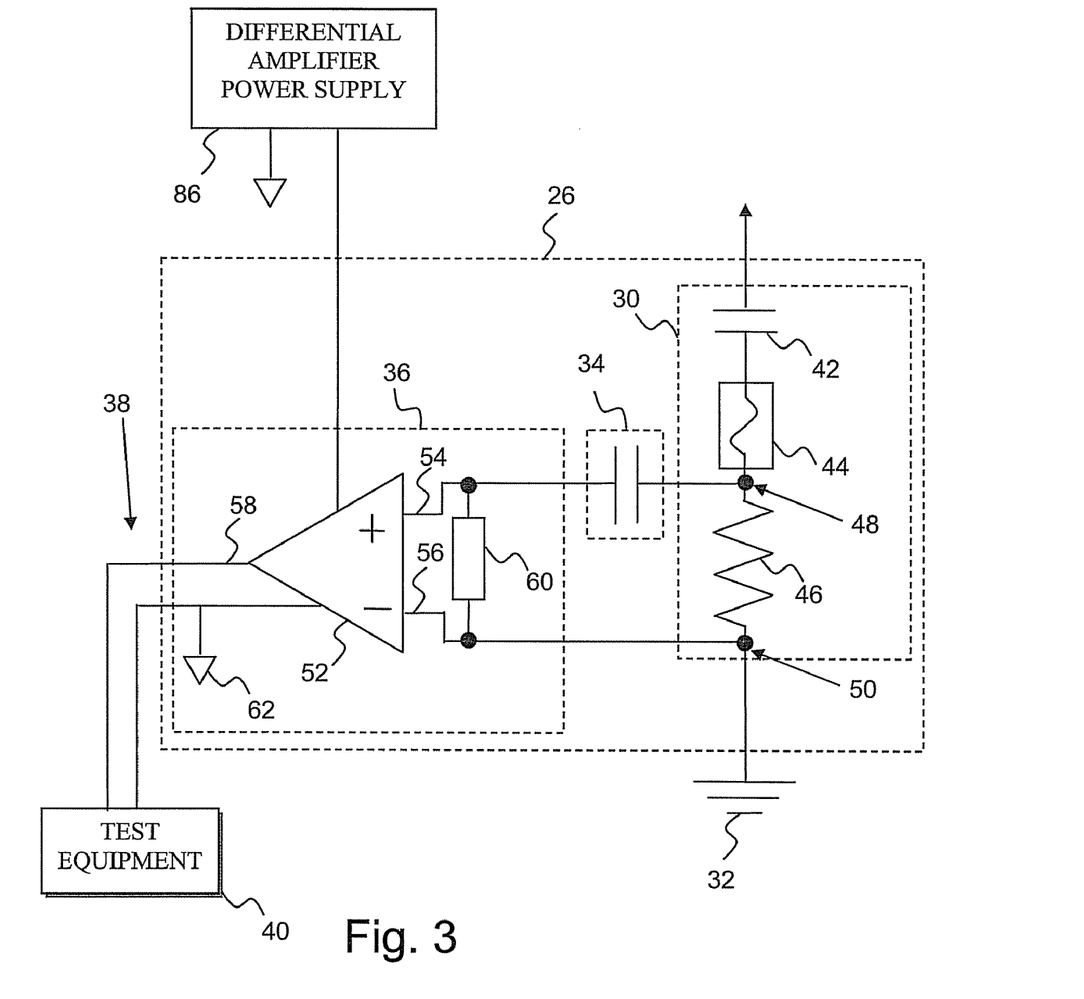
FIG. 3 is a diagrammatic view of select components of a partial discharge coupler according to various aspects of the present invention.

Referring to FIG. 3, a partial discharge coupler 26 is illustrated according to various aspects of the present invention. The illustrated partial discharge coupler 26 includes a frequency dependent network 30 having a first filter component 42, a fuse component 44 and a load component 46. The frequency dependent network 30 filters the high voltage alternating current from the test equipment 40 (FIG. 2), and detects partial discharge pulses, which are communicated to the test equipment 40 as will be described in greater detail herein.

The first filter component 42 is configured to filter the high voltage, low frequency alternating current signal carried by the conductor of a connected electrical device from the load component 46 when the partial discharge coupler 26 is installed between the conductor and a ground, e.g., an isophase bus 20, 22, 24 and the earth ground 32. Correspondingly, the first filter component 42 is configured to pass detected high frequency partial discharge pulse signals to the load component 46, when the partial discharge coupler 26 is installed between the conductor and the ground. The first filter component 42 may be implemented, for example, using one or more capacitors that are configured to withstand the high voltage stress of an associated electrical device to which the partial discharge coupler 26 is attached, e.g., an isophase bus bar, which may be carrying thousands of volts. The capacitor may comprise any suitable material, such as glass/ceramic material(s), polymer films, etc., and may be cylindrical, puck-shaped, etc.

Because of the filtering caused by the interaction of the capacitor and the load resistor, the capacitor implementing the first filter component 42 is also referred to herein as an isolation capacitor. The isolation capacitor designates the interaction of the capacitor with the load component 46 to filter the high voltage alternating current signal carried by the conductor, e.g., of the signal carried by the isophase bus 20, 22 and 24 from the load component 46 and to pass the high frequency partial discharge pulses to the load component 46 with minimal attenuation.

In an application for monitoring partial discharges in an isophase bus, a capacitor having the ability to withstand the stress of a voltage up to approximately 5 Kilovolts to approximately 30 Kilovolts may be required. In addition to being able to operate under constant high voltage stress conditions, the capacitor should also be capable of passing partial discharge pulses, which may comprise high frequency transient signals.

As an illustrative example, the first filter component 42, e.g., a first capacitor, is under constant high voltage stress by virtue of being coupled at one end to the high voltage alternating current signal carried by the conductor of the isophase bus 20, 22 or 24 in the exemplary arrangement of FIG. 1. This exposure to high voltage stress causes the capacitor to age.

In a conventional partial discharge coupler, should the capacitor fail and should a conductive path to ground be formed, the resulting component failure may trip the corresponding turbine generator and may cause costly damage to the isophase bus works 16 and/or other system components. A resulting high energy arc may also persist for many seconds as the generator core magnetic flux decays. Accordingly, a failure resulting in a conductive path to ground can cause substantial damage to the system. Many bus works are custom made. As such, extended power outages may result if the bus works is damaged due to the increased difficulty in implementing repairs to the customized features of the bus works.

However, according to various aspects of the present invention, the frequency dependent network 30 includes a fuse component 44 that is provided to protect against potential damage due to component failure of the first filter component 42. The fuse component 44 is configured to provide overload protection to the high voltage electrical application, the partial discharge coupler 26 and/or downstream test equipment 40 if a signal through the fuse component 44 exceeds a predetermined fuse condition, e.g., exceeds a predetermined current as may occur should the first filter component fail. For example, the fuse component 44 may isolate the partial discharge coupler 26 from the conductor of the attached electrical device in the event of a failure of the first filter component 42, e.g., a capacitor failure, and thereby limit the capacitor fault or short circuit current that might otherwise form a conductive path to ground, from causing damage to system components. The fuse component 44 should also be capable of passing high frequency transient signals with minimal attenuation.

In an exemplary implementation where the partial discharge coupler 26 is coupled to an isophase bus works such as described with reference to FIG. 1, the fuse component 44 should be configured to provide separation of the components of the partial discharge coupler 26 downstream of the first filter component 42 and fuse component 44 from the high voltage bus within a fraction of the 60 cycle line period, should the first filter component 42 fail. Moreover, the fuse component 44 should be capable of withstanding the bus voltage after the fuse has blown.

The load component 46 defines a first node 48 and a second node 50. The first node 48 is connected to the remainder of the network, e.g., the fuse component 44 as shown, and the second node 50 is coupled to the ground 32 when the partial discharge coupler 26 is installed between the conductor of the electrical device and the ground. The load component 46 may be implemented for example, by a resistor, as will be described in greater detail herein.

The frequency dependent network 30 is illustrated in the exemplary partial discharge coupler 26 as a series network having the fuse component serially connected between the first filter component 42 and the load component 44. In practice, the components may be rearranged into other configurations. For example, the first filter component 42 may be relocated between the fuse component 44 and the load component 46, etc. Other arrangements of the components of the frequency dependent network 30 and/or alternative components may alternatively be implemented, so long as the partial discharge pulses of interest are filtered from the high voltage, alternating current signal carried by the conductor. For example, the load component 46 may alternatively be replaced with other structures such as an inductor or transformer, so long as the high frequency partial discharge pulse information can be filtered from the high voltage alternating current signal carried by the conductor of the attached electrical device.

The partial discharge coupler 26 includes an amplifier circuit 36 that is coupled to the frequency dependent network 30 by a coupling component 34. The amplifier circuit 36 may comprise, for example, a differential amplifier 52 having a first differential input 54, a second differential input 56 and an output 58. The differential nature of the inputs 54 and 56 enables the differential amplifier 52 to reject common mode signals, noise, interference, etc., from the input of the differential amplifier 52 and hence the output thereof, such as from induced 60 Hz cycles of the high voltage signal carried by the conductor of the isophase bus.

The first differential input 54 of the differential amplifier 52 is coupled to the first node 48 of the load component 46 via the series connected coupling component 34. The second differential input 56 of the differential amplifier 52 is coupled to the second node 50 of the load component 46 and is thus coupled to the earth ground 32 when the partial discharge coupler 26 is suitably installed for partial discharge detection.

The differential amplifier 52 is configured to electrically isolate the partial discharge signal removed from the isophase bus, thus providing an output 58 that is isolated from the first ground connection 32, e.g., earth ground. For example, the output 58 of the differential amplifier 52 is taken relative to a second ground 62, which is different from the first ground 32. Thus, the output 58 of the differential amplifier 52 is electrically isolated from the signals appearing across load component 46 of the frequency dependent network 30. This electrically isolated output 58 may be evaluated to monitor the condition of the generator 12, step-up transformer 14, bus works 16, etc. using partial discharge testing/analysis equipment 40. For example, as illustrated, the output 58 of the differential amplifier 52 couples to the output 38, e.g., wires that connect to test equipment 40.

Partial discharge pulses are typically small signal level, e.g., approximately 100 millivolts in magnitude, high frequency pulses that attenuate rapidly. However, other types of pulses carried by the conductor can reach relatively large voltages, e.g., hundreds to thousands of volts. For example, high voltage spikes may occur during normal unit trips when the voltage swing is within a specific region at the time of the unit trip. Depending upon where in the cycle the voltage is, e.g., relative to the zero crossing, inductance/kickback can produce a high voltage spike reaching hundreds of volts. Moreover, grid line faults (although infrequent) may also produce high frequency pulses that can reach thousands of volts in magnitude. As such, it is possible for high voltage spikes to appear across the load component 46.

However, as illustrated, a protection device 60 may be electrically coupled between the first and second differential inputs 54, 56 of the differential amplifier 52 for providing overload protection, e.g., to protect the differential amplifier 52 and other downstream components from damage caused by unusually large voltage spikes that may appear across the load component 46. For example, the protection device 60 may be designed to electrically conduct when a low set voltage is reached. This keeps otherwise high voltage pulses from the inputs 54, 56 of the differential amplifier 52.

The protection device 60 may be implemented, for example, as a spark gap, surge suppressor, gas discharge, etc., which offers a high impedance to low voltage partial discharge pulse signals but becomes conductive should a threshold voltage level be exceeded. The surge suppressor thus limits the peak voltage that can appear across the inputs 54, 56 of the differential amplifier 52, thus protecting the differential amplifier 52 from fast and high pulses sometimes experienced in a normal unit trip. Thus, the protection device 60 prevents spikes from appearing across the differential amplifier inputs 54, 56. Moreover, as noted above, the differential configuration of the differential amplifier 52, i.e., differential inputs 54, 56 prevents common mode noise such as magnetic field interference from appearing across the output 58 of the differential amplifier 52.

In contrast, conventional partial discharge couplers allow these relatively large voltage pulses to pass through the partial discharge coupler and reach the partial discharge testing/analyzer circuits. For example, in a conventional partial discharge design, a coupling capacitor is connected to a conductor, e.g., carrying a high voltage 60 Hz signal and a current transformer is placed on the low potential side of a coupling capacitor. Essentially, the low voltage end of the coupling capacitor is grounded and the current transformer is placed around this ground connection wire.

This conventional configuration may prevent the high voltage 60 Hz signal from reaching a corresponding coupling transformer. However, high voltage spikes that may occur during normal unit trips, grid line faults and other conditions that can produce high magnitude voltage pulses are passed through the coupling transformer and can result in damage to expensive, high speed partial discharge monitor/analyzer circuits. Moreover, should the coupling capacitor fail, the current transformer is exposed to generator phase voltage which can then be carried to the partial discharge monitor/test equipment thus causing damage to the testing equipment.

However, according to various aspects of the present invention, the wiring of the output 38 is inherently safe, as the high voltage pulse conditions described above are isolated from the downstream equipment 40 by virtue of the electrically isolated differential output of the differential amplifier 52, and/or the protection device 60. As such, the occurrence of a high voltage pulse across the load component 46 will not harm downstream test equipment 40.

In an exemplary implementation, the coupling component 34 is coupled in series between the first differential input 54 of the differential amplifier 52 and the first node 48 of the load component 46. The coupling component 34 is configured to pass high frequency partial discharge signals detected across the load component 46 to the differential amplifier 52, and to filter low frequency alternating current signals from the differential amplifier 52.

The coupling component 34 may be implemented for example, by a coupling capacitor. Because the coupling capacitor interacts with the input impedance of the differential amplifier, the coupling capacitor value may be chosen to provide frequency selectivity and is thus also referred herein as a frequency selective coupling capacitor. For example, the coupling capacitor value may be selected such that the coupling component 34 serves as a redundant line of protection in case the first filter component 42 fails by filtering the high voltage, alternating current from the differential amplifier 52. The coupling capacitor 34 is only under high voltage stress should the load resistor open.

Figure 4:
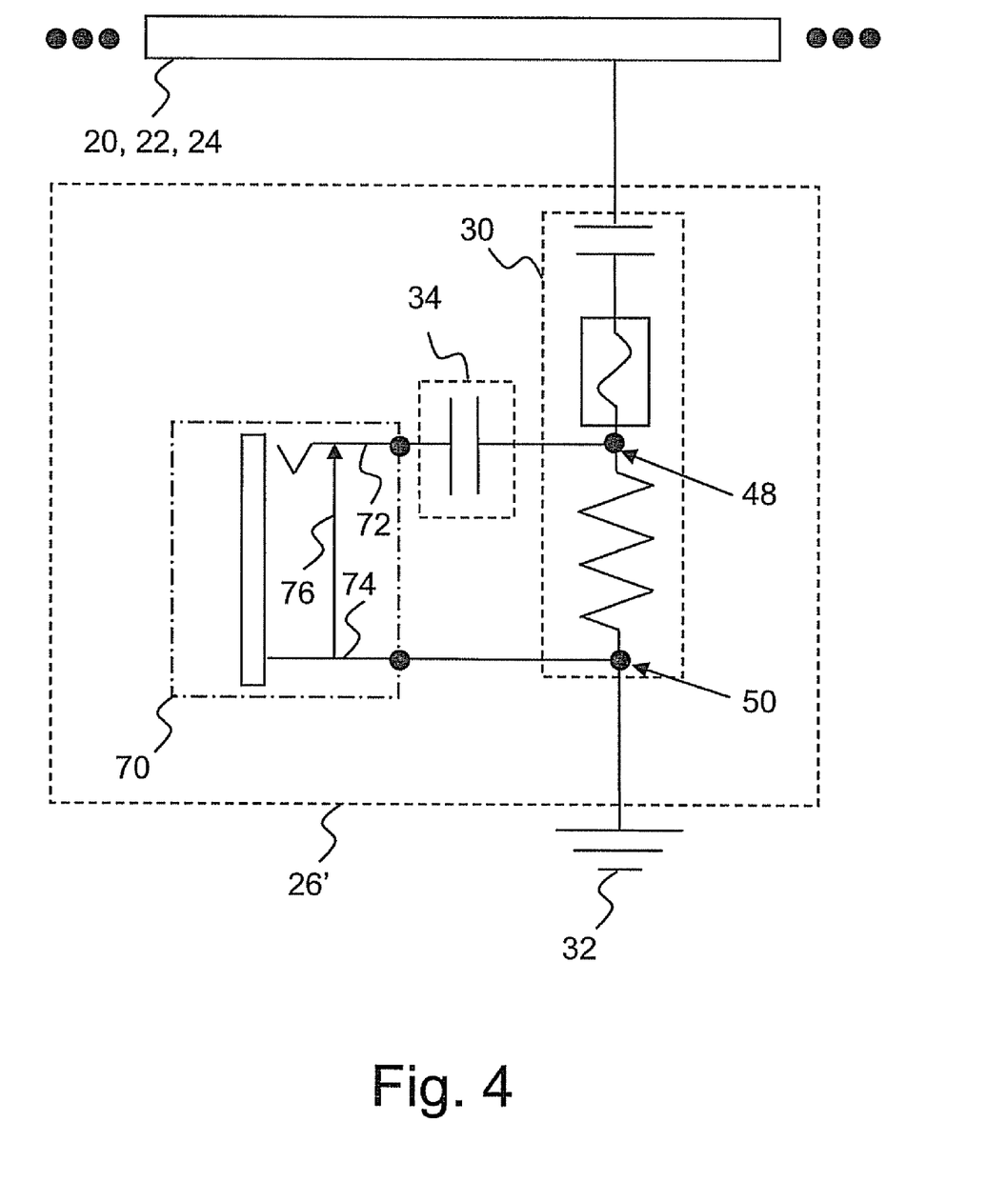
FIG. 4 is a diagrammatic view of selected components of a partial discharge coupler implemented with a pluggable configuration according to various aspects of the present invention.
Figure 5:
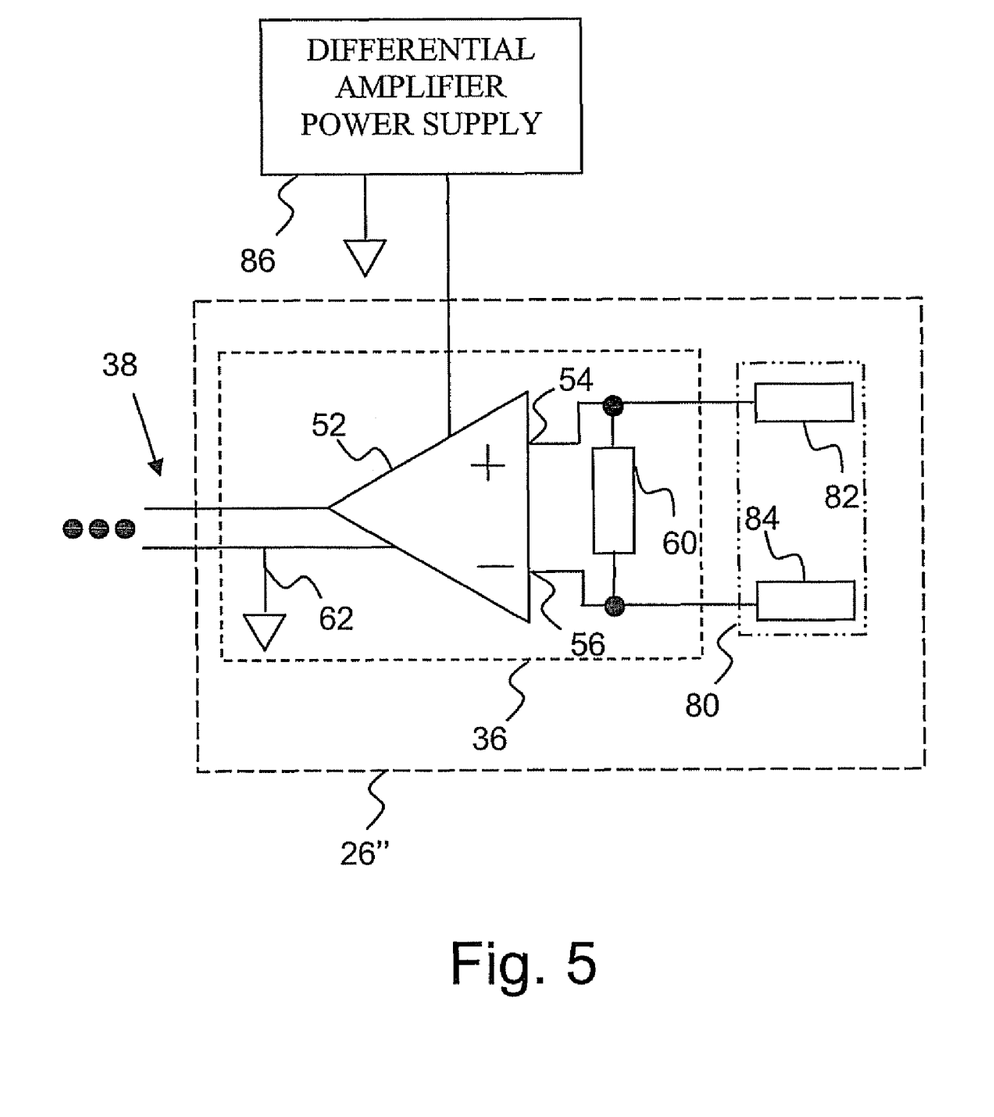
FIG. 5 is a diagrammatic view of selected components of a partial discharge coupler implemented with a pluggable configuration according to various aspects of the present invention.

Referring to FIGS. 4 and 5, according to various aspects of the present invention, the partial discharge coupler 26 may be implemented using two or more assemblies 26' (FIG. 4) and 26" (FIG. 5) that couple together using a coupling arrangement. With particular reference to FIG. 4, in an exemplary arrangement, a first partial discharge coupler assembly 26' may include the frequency dependent network 30 coupled to the first frequency selective filter 34 set out and described more fully herein, e.g., with reference to FIGS. 1-3.

The first partial discharge coupler assembly 26' may further comprise a connector socket 70. The connector socket 70 includes a first socket connection 72, a second socket connection 74 and a shorting connection 76. The first socket connection 72 defines a first contact that is electrically connected to the coupling component 34. The second socket connection 74 defines a second contact that is electrically coupled to the load resistor/ground connection, e.g., at node 50. The shorting connection 76 electrically couples the first socket connection 72 to the second socket connection 74 when no corresponding jack is plugged into the connector socket 70. Moreover, the shorting connection 76 electrically disconnects the first socket connection 72 from the second socket connection 74 when a corresponding plug is connected to the connector socket 70. The coupling component 34 is coupled serially between the first socket connection 72 and the first node 48 of the load component 46.

Referring to FIG. 5, a second partial discharge coupler assembly 26" comprises a connector plug 80 configured to mate with the connector socket 70 of FIG. 4. The connector plug 80 includes a first plug connector 82 that is configured to mate with the first socket connection 72 of the connector socket 70, and a second plug connector 84 that is configured to mate with the second socket connection 74 of the connector socket 70. Moreover, when the connector plug 80 is suitably mated with the connector socket 70, the shorting connection 76 of the connector socket 70 is opened so as to break the electrical short between the first socket connection 72 and the second socket connection 74.

The first plug connector 82 couples to the first input 54 of the differential amplifier 52. Correspondingly, the second plug connector 84 couples to the second input 54 of the differential amplifier 52. The protection device 60 may also be electrically coupled between the first and second differential inputs 52, 54 substantially as described in greater detail herein.

In this regard, the differential amplifier 52 may be selectively attached to, and removed from the frequency dependent network 30 via the plug 80 and corresponding connector socket 70. When the plug 80 is disconnected from the corresponding connector socket 70, the shorting connection 76 of the connector socket 70 shunts the first socket connection 72 to the second socket connection 74. When the plug 80 is inserted into the connector socket 70, the differential amplifier 52 is connected between the first socket connection 72 and the second socket connection 74, and the shorting connection 76 opens the short between the first and second socket connections 72, 74. As such, either the differential amplifier 52 and/or a shunt (via the shorting connection 76) is electrically connected (in place) across the connector socket 70. As such, the first socket connection 72, and thus the frequency selective coupling component 34, is not left in an electrically open circuit state (one end floating).

When the first partial discharge coupler assembly 26' is mated with the second partial discharge coupler assembly 26", the partial discharge coupler 26', 26" is electrically the same as the partial discharge coupler 26 described with reference to FIGS. 1-3. However, under the arrangement of FIGS. 4 and 5, the second partial discharge coupler assembly 26" may be disconnected/unplugged from the first partial discharge coupler assembly 26', e.g., for storage, repair, servicing, repositioning/re-use, etc. When the second partial discharge coupler assembly 26" is unplugged from the first partial discharge coupler assembly 26', the shorting connection 76 of the connector socket 70 shorts the coupling component 34 to ground, and allows the amplifier circuitry 36 to be safely removed from the first partial discharge coupler assembly 26'.

In this regard, the first partial discharge coupler assembly 26' may be fixedly installed in the environment, e.g., between an isophase bus 20, 22, 24 and a ground connection 32. The second partial discharge coupler assembly 26" may be selectively plugged into the first partial discharge coupler assembly 26', e.g., during partial discharge pulse testing, and the second partial discharge coupler assembly 26" may be detached from the first partial discharge coupler assembly 26', e.g., when not performing partial discharge pulse testing.

A differential amplifier power supply 86 is also illustrated in FIG. 5. The differential amplifier power supply 86 may be a single ended supply, or a bi-polar supply, depending upon the specific electronics implemented, and in particular, to the type of differential amplifier utilized. In that regard, other circuitry related to biasing, conditioning, filtering, etc., may be required, depending upon the amplifier and power supply implementation. Moreover, the power supply 86 may attach to and couple power to the second partial discharge coupler assembly 26" in any appropriate manner. For example, the power supply 86 may attach with and/or otherwise be part of the second partial discharge coupler assembly 26". Alternatively, the power supply 86 may plug into the second partial discharge coupler assembly 26" or otherwise provide power to the amplifier circuitry 36 when the second partial discharge coupler assembly 26" is plugged into or otherwise docked with the first partial discharge coupler assembly 26'.

Figure 6:
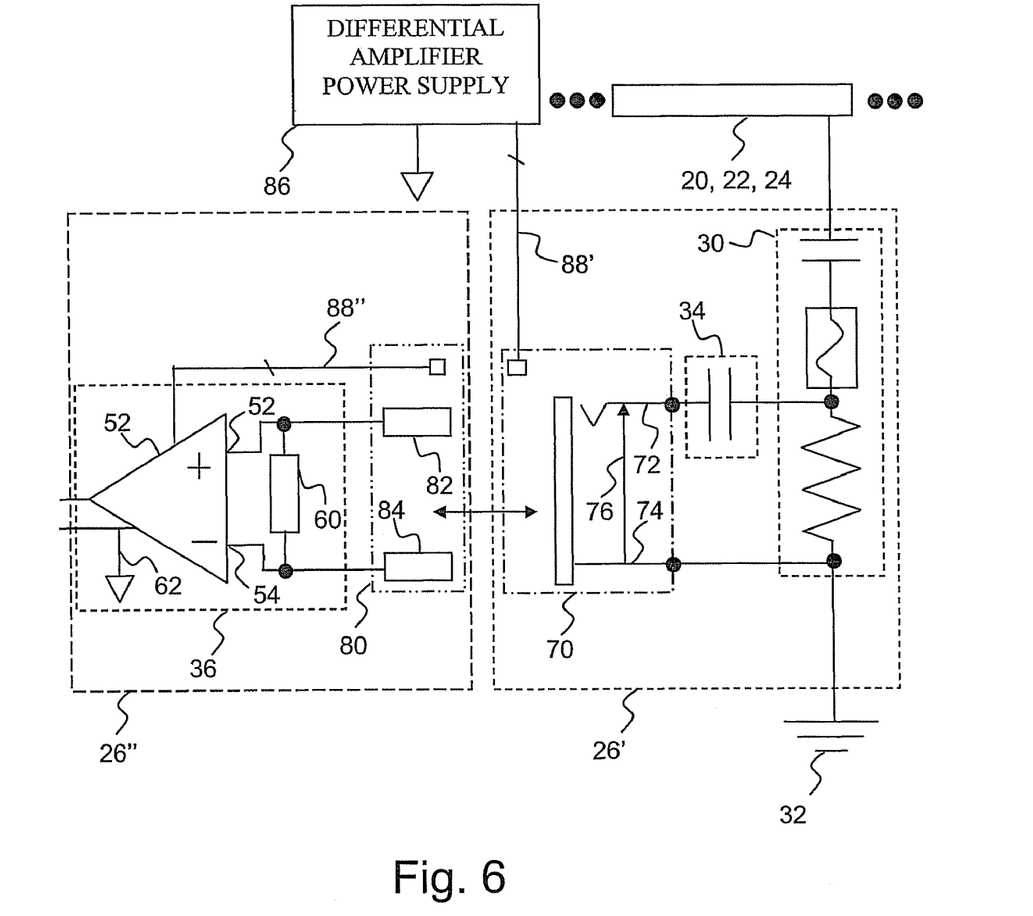
FIG. 6 is a diagrammatic view of the pluggable configuration of FIGS. 4 and 5 according to various aspects of the present invention.

Referring to FIG. 6, the second partial discharge coupler assembly 26" is illustrated as being inserted into the first partial discharge coupler assembly 26' to illustrate an exemplary manner in which the amplifier circuitry 36 may receive power. For example, a corresponding connecting arrangement may be required to couple the power supply 86 to the amplifier, depending upon the specific implementation. While the connector socket 70 is illustrated as having two inputs in FIG. 4, that is merely for purpose of clarity of discussion of coupling the partial discharge information from the load resistor to the amplifier. In practice, other more complicated plug arrangements may be utilized, e.g., which also couple power to the amplifier circuitry 36, e.g., using coupling arrangement 88' and 88". Under this arrangement, the power supply 86 may be considered part of, integrated with, or otherwise coupled to the first partial discharge coupler assembly 26' shown in FIG. 4. As yet another illustrative example, the DC power required by the differential amplifier 52 may be provided as separate wiring that is bundled with the output 38 that connects the partial discharge coupler 26 to the test equipment 40.

As an illustrative example of the partial discharge coupler 26 according to various aspects of the present invention, e.g., as shown in any of the Figures herein, assume that the partial discharge coupler 26 is connected between a conductor of a power bus, e.g., an isophase bus 20, 22, 24 and an earth ground 32. The isophase bus conductor may carry a high voltage, low frequency alternating current signal, such as a 60 Hertz power signal up to, or in excess of 20-30 Kilovolts in magnitude.

Further, assume that the fuse component 44 comprises a fast clearing fuse (sub 60 Hz cycle operation) to provide disconnect of the partial discharge coupler from the power bus if the predetermined fuse condition is exceeded. As an illustrative example, the fuse component 44 may comprise a 0.5 ampere, 0.008 seconds high voltage fast clearing fuse capable of passing high frequency transient signals such as partial discharge pulses with minimal attenuation. The fast clearing fuse removes the partial discharge coupler 26 from the isophase bus 20, 22, 24 within a fraction of an electrical cycle should the first filter component 42, e.g., an isolation capacitor fail. This serves to protect the downstream electronics, e.g., the partial discharge analysis equipment and other components of the system from potentially damaging voltage conditions.

Further, assume that the first filter component 42 comprises a high voltage isolation capacitor capable of withstanding the stress of the corresponding high voltage conductor, and that the load component 46 comprises a load resistor. The isolation capacitor may have a value in the range of approximately 100 picofarads. Correspondingly, the load resistor may have a value in the range of approximately 100 Ohms to 1,000 Ohms. Under this arrangement, the isolation capacitor appears like a high impedance to the high voltage 60 Hz power signal carried by the conductor of the isophase bus. However, the isolation capacitor appears as a low impedance to a high frequency partial discharge pulse. For example, the corner frequency of the high pass filter formed by the isolation capacitor and the load resistor may be in the range of approximately 1.59 MHz to 15.9 MHz for the above exemplary component values. In general, since this is a high pass filter, frequencies above the corner frequency are passed. However, in practice, the highest pass frequency is determined by the intrinsic small inductive nature of the circuit. As such, the exemplary circuit values may effectively pass signals in the range of 1.59 MHz to 200 MHz as an illustrative example.

The particular implemented values for the isolation capacitor and load resistor may vary, depending upon factors such as the frequency range of the partial discharge pulses of interest. For example, in some implementations, the isolation capacitor may be required to pass partial discharge signals having a pulse frequency in the megahertz range and other applications may require the isolation capacitor to pass partial discharge signals having a pulse frequency in the hundreds of megahertz range. For example, it may be desirable to extend the corner frequency up to 200 MHz or greater. Still further, yet other exemplary applications may require the isolation capacitor to pass partial discharge pulse signals having a pulse frequency in the gigahertz range.

Returning to the present example, high frequency transient signals, e.g., partial discharge pulses, from the insulation surrounding the corresponding conductor of generator 12, step-up transformer 14 and/or generator bus works 16 are passed through the high voltage capacitor/first filter component 42 and are presented across the load resistor/load component 46. Thus, the high voltage isolation capacitor appears as a high impedance load to the high voltage, 60 Hz bus power voltage carried by the isophase buses 20, 22, 24. Moreover, the high voltage isolation capacitor appears as a low impedance to high frequency partial discharge pulses. Since the high voltage isolation capacitor (and fuse component 44) provides a low impedance to partial discharge pulses, the partial discharge pulse voltages of interest appear almost entirely across the load resistor, while substantially none of the 60 Hz bus voltage appears across resistor.

The partial discharge pulse signals are removed from across load resistor through the coupling component 34 and are input to the differential amplifier 52. The coupling capacitor 34 may further be configured, e.g., via selection of an appropriate capacitance value, e.g., in view of the input impedance of the differential amplifier 52, to prevent the flow of high voltage alternating current, e.g., high voltage 60 Hz signal current carried by the conductor of the isophase bus 20, 22, 24 into the differential amplifier 52 should the isolation capacitor of the first filter component 42 fail. The output 58 of the differential amplifier 52 is conveyed to appropriate testing and analysis equipment 40.

Figure 7:
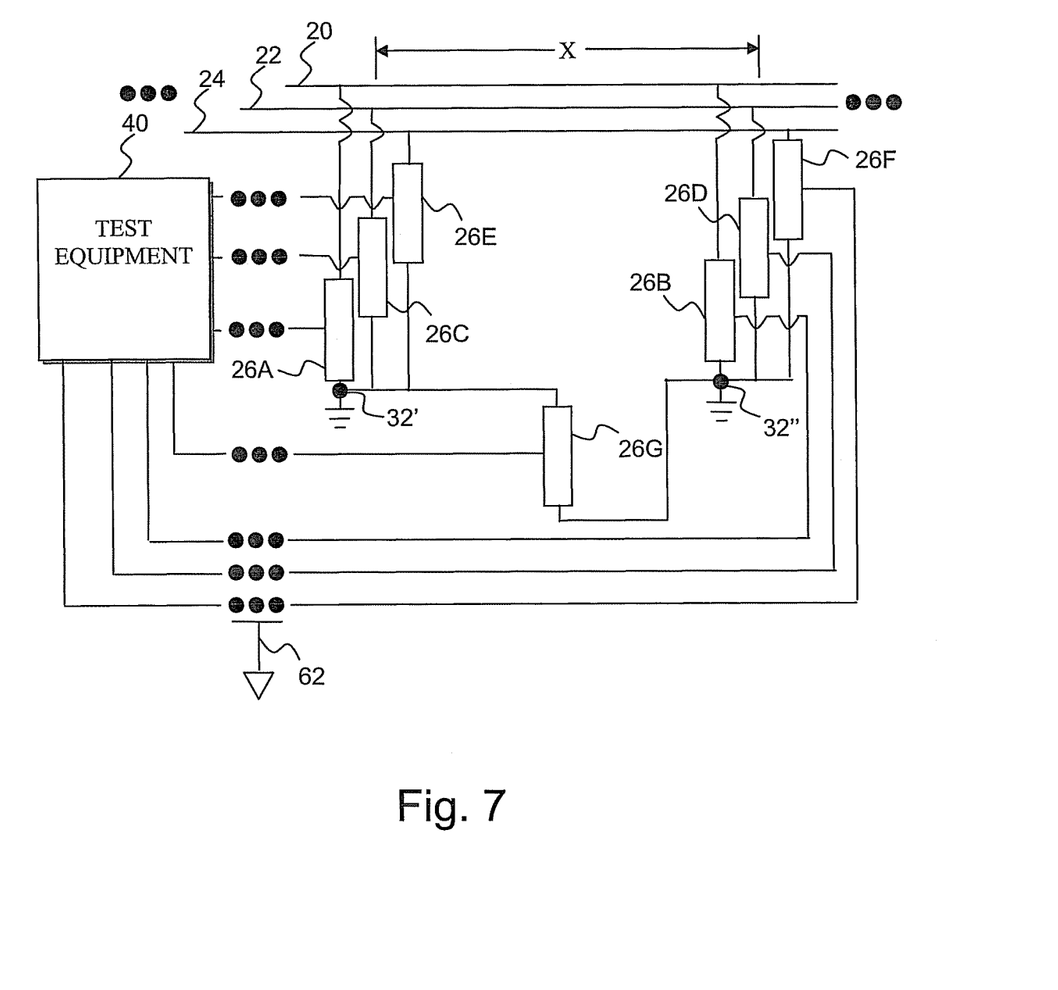
FIG. 7 is a diagrammatic view of a system for measuring partial discharge pulses using partial discharge couplers according to various aspects of the present invention.

Referring to FIG. 7, yet another exemplary partial discharge monitoring system is provided. In the exemplary application of FIG. 7, according to various aspects of the present invention, a plurality of partial discharge couplers 26 are utilized to facilitate monitoring of partial discharge pulses in a generator system by detecting partial discharges along the three isophase bus 20, 22, 24. In particular, a first partial discharge coupler 26A is electrically connected between a first isophase bus 20 and a first earth ground 32'. A second partial discharge coupler 26B is electrically connected between the first isophase bus 20 and a second earth ground 32", spaced from the first partial discharge coupler 26A by a predetermined distance, e.g., 30-40 feet. A third partial discharge coupler 26C is electrically connected between a second isophase bus 22 and the first earth ground 32'. A fourth partial discharge coupler 26D is electrically connected between the second isophase bus 22 and the second earth ground 32", spaced from the third partial discharge coupler 26C by a predetermined distance, e.g., 30-40 feet. Similarly, a fifth partial discharge coupler 26E is electrically connected between a third isophase bus 24 and the first earth ground 32'. A sixth partial discharge coupler 26F is electrically connected between the third isophase bus 24 and the second earth ground 32", spaced from the fifth partial discharge coupler 26E by a predetermined distance, e.g., 30-40 feet. A seventh partial discharge coupler 26G may be utilized to monitor the difference in ground potential between the first earth ground 32' and the second earth ground 32".

Each partial discharge coupler may be substantially as set out in greater detail herein with regard to any one or more of FIGS. 1-6. For example, although each partial discharge coupler 26A, 26B, 26C, 26D, 26E, 26F and 26G is positioned between a corresponding conductor and an earth ground 32', 32". The output of each partial discharge coupler 26, which is coupled to the test equipment 40, is electrically isolated from the earth grounds 32', 32" and isophase buses 20, 22 and 24, as schematically represented by the separate ground 62. The above system allows time of flight and other tests to be conducted on partial discharge pulses using any desired processing techniques, e.g., to measure partial discharge pulses, to locate the origin of partial discharge pulses, etc.

According to various aspects of the present invention, the differential amplifier 52 described more fully herein, may be used as a buffer for driving the partial discharge information along the output 38 to the appropriate testing equipment 40. This avoids the losses encountered in conventional partial discharge couplers. For example, as noted in greater detail herein, partial discharge pulses are typically small signal level, e.g., 100 millivolts in magnitude, high frequency pulses that attenuate rapidly as they travel from the partial discharge coupler towards the testing equipment. This may result in the loss of smaller amplitude partial discharge pulses when traveling from/through a conventional partial discharge coupler to corresponding partial discharge testing equipment. However, according to various aspects of the present invention, the partial discharge coupler 26 comprises a differential amplifier 52 that buffers the detected partial discharge pulses, and thus preserves the magnitude of the pulse, preventing partial discharge pulses from attenuating, regardless of the distance that the detected signal has to be transmitted to reach the corresponding testing equipment 40.

Moreover, the differential amplifier 52 can be utilized to detect partial discharges with a better signal to noise ratio and interference rejection because, for example, the ground of the output 58 of the differential amplifier 52 is isolated from the ground 32 of the partial discharge coupler 26, and the inputs 54, 56 of the differential amplifier 52 are not isolated from the frequency dependent network 30, thus common mode magnetic field interference induced into the signal path to the differential amplifier 52, e.g., by the signal carried by the conductor of the corresponding electrical device is rejected, etc. That is, the superposition of external interference, noise, etc., can be mitigated.

Still further, the differential amplifier can be used to amplify, normalize, buffer, calibrate, compensate, level match and/or perform other gain, impedance or data processing techniques to manipulate the detected partial discharge information for preservation of an accurate depiction of partial discharge pulse information for analysis by corresponding testing equipment 40. Conventional partial discharge couplers and coupling systems are passive and are thus subject to signal losses, interference and noise. However, for example, gain may be applied by the differential amplifier 52 according to various aspects of the present invention, to overcome the signal to noise ratio of the line necessary to communicate partial discharge information to the corresponding test equipment. Thus, partial discharge pulses that would eventually get buried in noise in conventional systems can be readily detected and measured according to various aspects of the present invention.

Additionally, a conventional partial discharge coupler may utilize a passive circuit including a high frequency current transformer placed around a grounded high voltage capacitor circuit. This coupler circuit is connected to the high voltage bus at one end and earth ground at the other. While this design is simple, it suffers from performance constraints and other concerns. This form of partial discharge coupler however, distorts the partial discharge pulse, making it difficult to determine accurately, the exact time that the pulse arrived at the coupler on the isophase conductor. However, accurate pulse timing may be required to ascertain the origin of each partial discharge pulse.

However, the partial discharge coupler 26 according to various aspects of the present invention includes active circuitry 36, such as a differential amplifier 52, which provides a high impedance input to the partial discharge pulses, thus minimizing attenuation of the pulse due to the partial discharge coupler itself. As such, deformation of the partial discharge pulse due to loading that typically occurs in conventional partial discharge couplers may be minimized. Moreover, the active circuitry 36 can drive the lines associated with the output 38 so that the transmitted partial discharge information is preserved in a much more accurate manner.

Moreover, according to various aspects of the present invention, the first filter component 42, the fuse component 44, the coupling component 34, the overload protection 36, all provide redundancy to prevent the possibility of a high voltage propagating from the partial discharge coupler 26 through signal wires that carry the partial discharge pulse information to corresponding test equipment 40.

Having thus described the invention of the present application in detail and by reference to embodiments thereof, it will be apparent that modifications and variations are possible without departing from the scope of the invention defined in the appended claims.

What is claimed is:

1. A partial discharge coupler for detecting partial discharges in a conductor carrying a high voltage alternating current signal, the partial discharge coupler comprising:
   a frequency dependent network having a first filter component, a fuse component and a load component, wherein:
      the first filter component is configured to filter the high voltage, low frequency alternating current signal carried by the conductor from the load component and to pass high frequency partial discharge pulse signals to the load component when the partial discharge coupler is installed between the conductor and a first ground;
      the fuse component is configured to provide overload protection to the partial discharge coupler if a signal through the fuse component exceeds a predetermined fuse condition;
      the load component defines a first node and a second node, the first node connected to the remainder of the network and the second node coupled to the first ground when the frequency dependent network is installed between the conductor and the first ground;
   a differential amplifier having a first differential input, a second differential input and an output, wherein:
      the second differential input of the differential amplifier is coupled to the second node of the load component, and
      the output of the differential amplifier is configured to provide an output that is isolated from the first ground connection for communicating detected partial discharge signals to partial discharge test equipment; and
   a frequency selective coupling component that is coupled in series between the first differential input of the differential amplifier and the first node of the load component configured to pass high frequency partial discharge signals to the differential amplifier, and to filter low frequency alternating current signals from the differential amplifier.

2. The partial discharge coupler according to claim 1, wherein:
   the frequency dependent network comprises a series network;
   the first filter component comprises a capacitor configured to withstand a high voltage stress when the partial discharge coupler is installed between the conductor and a first ground;
   the fuse component comprises a fuse in series with the capacitor; and
   the load component comprises a resistor in series with the capacitor and the fuse.

3. The partial discharge coupler according to claim 2, wherein the capacitance of the first filter component and the resistance of the load component are selected so as to filter the low frequency alternating current signal from the load and to pass high frequency partial discharge pulses to the differential amplifier.

4. The partial discharge coupler according to claim 1, wherein the frequency selective coupling component comprises a capacitor.

5. The partial discharge coupler according to claim 1, further comprising a surge suppression component coupled between the first and second differential inputs of the differential amplifier, the surge suppression component configured to protect the differential amplifier if the differential voltage seen by the differential inputs exceeds at least one predetermined condition.

6. The partial discharge coupler according to claim 1, wherein the differential amplifier is configured to reject common mode magnetic field interference induced into the signal path to the differential amplifier by the signal carried by the conductor.

7. The partial discharge coupler according to claim 1, wherein the differential amplifier is configured to provide at least one of buffering, scaling, normalizing or amplifying of the partial discharge pulse signals detected across the load component.

8. A partial discharge coupler for detecting partial discharges in a conductor carrying a high voltage alternating current signal, the partial discharge coupler comprising:
a frequency dependent network having a first filter component, a fuse component and a load component, connected in series, wherein:
the first filter component is configured to filter the high voltage, low frequency alternating current signal carried by the conductor from the load component and to pass high frequency partial discharge pulse signals to the load component when the partial discharge coupler is installed between the conductor and aground;
the fuse component is configured to provide overload protection to the partial discharge coupler if a signal through the fuse component exceeds a predetermined fuse condition;
the load component defines a first node and a second node, the first node connected to the remainder of the series network and the second node coupled to the ground when the frequency dependent network is installed between the conductor and the ground; and
a connector socket having a first socket connection, a second socket connection and a shorting connection, wherein:
the shorting connection electrically couples the first socket connection to the second socket connection when no corresponding plug is inserted into the socket connection,
the shorting connection electrically disconnects the first socket connection from the second socket connection when a corresponding plug is connected to the connector socket, and
the second socket connection is coupled to the second node of the load component; and
a frequency selective coupling component that is coupled in series between the first socket connection of the connector socket and the first node of the load component.

9. The partial discharge coupler according to claim 8, further comprising:
a differential amplifier having a first differential input, a second differential input and an output, the output of the differential amplifier configured to provide an output that is isolated from the ground connection to the frequency dependent network for communicating detected partial discharge signals to partial discharge test equipment;
a plug coupled to the differential amplifier that can be selectively plugged into and removed from connection with the connector socket, such that when the plug is connected to the connector socket:
the first differential input of the differential amplifier is coupled to the frequency selective coupling component via the first socket connection; and
the second differential input of the differential amplifier is coupled to the second node of the load component via the second socket connection.

10. The partial discharge coupler according to claim 9, further comprising a surge suppression component coupled between the first and second differential inputs of the differential amplifier, the surge suppression component configured to protect the differential amplifier if the differential voltage seen by the differential inputs exceeds at least one predetermined condition.

11. The partial discharge coupler according to claim 9, wherein the differential amplifier is configured to reject common mode magnetic field interference induced into the signal path to the differential amplifier by the signal carried by the conductor.

12. The partial discharge coupler according to claim 8, wherein:
the first filter component comprises a capacitor configured to withstand a high voltage stress when the partial discharge coupler is installed between the conductor and a first ground;
the fuse component comprises a fuse in series with the capacitor; and
the load component comprises a resistor in series with the capacitor and the fuse.

13. The partial discharge coupler according to claim 12, wherein the capacitance of the first filter component and the resistance of the load component are selected so as to filter the low frequency alternating current signal from the load and to pass high frequency partial discharge pulses to the load.

14. The partial discharge coupler according to claim 8, wherein the frequency selective coupling component comprises a capacitor.

15. A partial discharge coupling system for coupling an electrical generator having at least one bus bar that carries a high voltage, low frequency alternating current signal to partial discharge testing equipment comprising:
at least two partial discharge couplers associated with each bus bar that are spaced from each other by a predetermined distance, the partial discharge couplers having:
a frequency dependent network for installation between the associated bus bar and a ground, including a first filter component, a fuse component and a load component, wherein:
the first filter component filters low frequency signals from the load component and passes high frequency partial discharge pulse signals to the load component; and
the load component defines a first node and a second node;
a differential amplifier having a first differential input, a second differential input and an output that is provided with respect to a reference that is isolated from the ground coupled to the load component, wherein the second differential input of the differential amplifier is coupled to the second node of the load component; and
a frequency selective coupling component coupled in series between the first differential input of the differential amplifier and the first node of the load component.

16. The partial discharge coupling system according to claim 15, wherein each differential amplifier is configured to provide at least one of normalizing, scaling, amplifying or buffering.

17. The partial discharge coupling system according to claim 15, wherein:

each frequency dependent network comprises a series network;

the first filter component comprises a capacitor configured to withstand a high voltage stress when the partial discharge coupler is installed between the conductor and a first ground;

the fuse component comprises a fuse in series with the capacitor; and the load component comprises a resistor in series with the capacitor and the fuse.

18. The partial discharge coupling system according to claim 17, wherein the capacitance of each first filter component and the resistance of each load component of a respective partial discharge coupler, are selected so as to filter the low frequency alternating current signal from the load and to pass high frequency partial discharge pulses to the associated differential amplifier.

19. The partial discharge coupling system according to claim 15, further comprising a surge suppression component coupled between the first and second differential inputs of each differential amplifier, the surge suppression component configured to protect the differential amplifier if the differential voltage seen by the differential inputs exceeds at least one predetermined condition.

20. The partial discharge coupling system according to claim 15, wherein each differential amplifier is configured to reject common mode magnetic field interference induced into the signal path to the differential amplifier by the signal carried by the conductor.

* * * * *